(12) United States Patent
Ueki et al.

(10) Patent No.: US 11,845,271 B2
(45) Date of Patent: Dec. 19, 2023

(54) ELECTRONIC DEVICE AND PRINTING APPARATUS HAVING CORRECTION UNIT THAT CORRECTS AN AMPLIFIER

(71) Applicant: CANON KABUSHIKI KAISHA, Tokyo (JP)

(72) Inventors: Hideyuki Ueki, Tokyo (JP); Shinya Ishikawa, Kanagawa (JP); Hironori Naka, Tokyo (JP); Hiroyuki Takahashi, Kanagawa (JP); Yuta Shinsawatsu, Kanagawa (JP); Kotaro Kimoto, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 171 days.

(21) Appl. No.: 17/488,146

(22) Filed: Sep. 28, 2021

(65) Prior Publication Data

US 2022/0105720 A1 Apr. 7, 2022

(30) Foreign Application Priority Data

Oct. 5, 2020 (JP) .................................. 2020-168659

(51) Int. Cl.
*H03F 1/30* (2006.01)
*B41J 2/045* (2006.01)
*H03M 1/12* (2006.01)

(52) U.S. Cl.
CPC ......... *B41J 2/0454* (2013.01); *B41J 2/04563* (2013.01); *H03F 1/30* (2013.01); *H03M 1/12* (2013.01)

(58) Field of Classification Search
CPC .. B41J 2/0454; B41J 2/04563; B41J 2/04513; B41J 2/04541; B41J 2/04553; B41J 2/0458; H03F 1/30; H03F 2200/375; H03M 1/12
USPC .................................................. 330/296, 289
See application file for complete search history.

(56) References Cited

U.S. PATENT DOCUMENTS

| | | | |
|---|---|---|---|
| 8,599,167 B2 * | 12/2013 | Joharapurkar | H03K 17/9622 345/173 |
| 9,216,601 B2 | 12/2015 | Naka | |
| 9,857,921 B2 * | 1/2018 | Pant | G06F 3/0446 |
| 9,868,282 B2 | 1/2018 | Ishikawa et al. | |
| 10,647,113 B2 | 5/2020 | Ueki | |
| 11,061,351 B2 | 7/2021 | Takahashi et al. | |
| 2014/0039867 A1 | 2/2014 | Higashidani et al. | |
| 2021/0294257 A1 | 9/2021 | Takahashi et al. | |

FOREIGN PATENT DOCUMENTS

JP 4220708 B2 2/2009

* cited by examiner

*Primary Examiner* — Hieu P Nguyen
(74) *Attorney, Agent, or Firm* — VENABLE LLP (57) ABSTRACT

An electronic device inputs a voltage from each of a first and a second constant voltage sources, amplifies the inputted voltage, and converts the inputted voltage or a voltage amplified by an amplifier into a digital value. Using a first and a second digital values based on the inputted voltage, and a third and fourth digital values based on the inputted, amplified and converted voltage, an amplification factor of the amplifier and an offset voltage of the amplifier are calculated, and the amplifier is corrected based on the calculated amplification factor and offset voltage.

15 Claims, 11 Drawing Sheets

ELECTRONIC DEVICE AND PRINTING APPARATUS HAVING CORRECTION UNIT THAT CORRECTS AN AMPLIFIER

BACKGROUND OF THE INVENTION

Field of the Invention

The present invention relates to an electronic device, a printing apparatus, and a correction method thereof, and more particularly, to a printing apparatus which performs printing by discharging ink onto a printing medium while reciprocatingly scanning a carriage on which an inkjet print head is mounted, for example, and a correction method therefor.

Description of the Related Art

An inkjet printing apparatus is an example of a typical printing apparatus for printing an image while scanning a carriage. A typical inkjet printing apparatus includes a print head formed by arranging an ink discharge port and a print element which is an energy generating unit for discharging ink droplets such as a heater or a piezo element in correspondence with each other. In the inkjet printing apparatus, an image is printed on a printing medium by repeating a printing scan in which the carriage on which a print head is mounted is moved in a predetermined direction and ink droplets are discharged onto a printing region, and a printing medium is conveyed in a direction intersecting the carriage movement direction.

In a thermal inkjet printing apparatus in which a heater is used as a print element, an ink tank filled with ink is connected to a print head, and a heater is driven and heated to generate bubbles boiled in the ink to discharge ink from the nozzle. In addition, the inkjet printing apparatus is provided with a mechanism for detecting an error in order to notify of an excessive temperature rise when the temperature is recognized to be higher than a temperature at which usage is envisioned. Furthermore, the energy to be applied to the heater is adjusted according to the ambient temperature of the print head, and adjustment is made so as to avoid unevenness in the image even when the device is used in environments with different temperature conditions.

To realize such a function, the print head is provided with a temperature detection diode for acquiring the ambient temperature of the print head. Since the temperature gradient of the temperature detection diode is very small at several mV per 1° C., and the minute voltage, after being amplified using an amplifier, is converted to a digital value by the A/D converter. Then, the ambient temperature of the print head can be calculated from the digital value after conversion.

Now, an amplifier used in the process of temperature sensing receives and amplifies the input voltage Vin to generate a voltage Vout, but in an actual amplifier, due to accuracy and manufacturing variations of its components, errors may occur in the output voltage Vout due to various factors. Therefore, since temperature information resulting from converting the output voltage Vout into a digital value is also a value containing an error, there are designs that take into consideration an excessive margin so that the device can operate without abnormality even if there are temperature differences. In Japanese Patent No. 4220708, in order to correct such an output error of an amplifier, correction of an error voltage of the amplifier is performed by providing a voltage correction circuit for correcting the error voltage of the amplifier.

However, in the above conventional example, it is necessary to provide a dedicated circuit for correction such as a reference voltage circuit for correcting the amplifier, an input selection circuit for selecting an external input and a reference voltage, and an error voltage correction circuit for correcting the correction value obtained from the reference voltage. This leads to an increase in the size and cost of the control circuit board. For this reason, there is a need for a configuration that corrects a voltage amplified by an amplifier that is also applicable to an inexpensive printing apparatus.

SUMMARY OF THE INVENTION

The present invention has been made in view of the above conventional example, and an object thereof is to provide an electronic device, a printing apparatus, and a correction method thereof that can correct variations in an amplifier incorporated in the device with a simple configuration.

One of the aspects of the present invention provides an electronic device, comprising an input unit configured to input a voltage from each of a first constant voltage source and a second constant voltage source, an amplifier configured to amplify the voltage inputted by the input unit, an AD converter configured to convert the voltage inputted by the input unit or a voltage resulting from amplifying the voltage by the amplifier into a digital value, and a correction unit configured to, based on a first digital value that is based on a voltage from the first constant voltage source and a second digital value that is based on a voltage from the second constant voltage source, which are inputted by the input unit and converted by the AD converter, and a third digital value that is based on a voltage from the first constant voltage source and a fourth digital value that is based on a voltage from the second constant voltage source, which are inputted by the input unit, amplified by the amplifier, and converted by the AD converter, calculate an amplification factor of the amplifier and an offset voltage of the amplifier, and according to the calculated amplification factor and offset voltage, correct the amplifier.

Further features of the present invention will become apparent from the following description of exemplary embodiments (with reference to the attached drawings).

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Note that in this specification, "print" encompasses forming not only meaningful information such as characters and shapes, but also meaningless information. Furthermore, "print" broadly encompasses cases in which an image or pattern is formed on a print medium irrespective of whether or not it is something that a person can visually perceive, and cases in which a medium is processed.

Also, "print medium" broadly encompasses not only paper used in a typical printing apparatus, but also things that can receive ink such as cloths, plastic films, metal plates, glass, ceramics, wood materials, hides or the like.

In addition, "ink" (sometimes referred to as "liquid") should be construed broadly as defined above for "printing". Accordingly, "ink" encompasses liquids that by being applied to a print medium can be supplied in the forming of images, designs, patterns or the like, processing of print mediums, or processing of ink (for example, insolubilization or freezing of a colorant in ink applied to a print medium).

Furthermore, unless otherwise specified, the term "nozzle" generally refers to a discharge port or a liquid path communicating therewith, and an element for generating energy used for ink discharge.

"print head substrate" (a head substrate) below does not indicate a mere substrate consisting of a silicon semiconductor but rather indicates a configuration in which elements, wiring lines, and the like are disposed.

Furthermore, "on the substrate" means not only simply on top of the element substrate, but also the surface of the element substrate, and the inside of the element substrate in the vicinity of the surface. Further, the term "built-in" in the present application does not mean that separate elements are simply disposed on the substrate surface as separate elements, but indicates that the elements are integrally formed and manufactured on an element board by a process for manufacturing semiconductor circuits or the like.

<Outline of Printing Apparatus (FIG. 1 and FIG. 2)>

Figure 1:
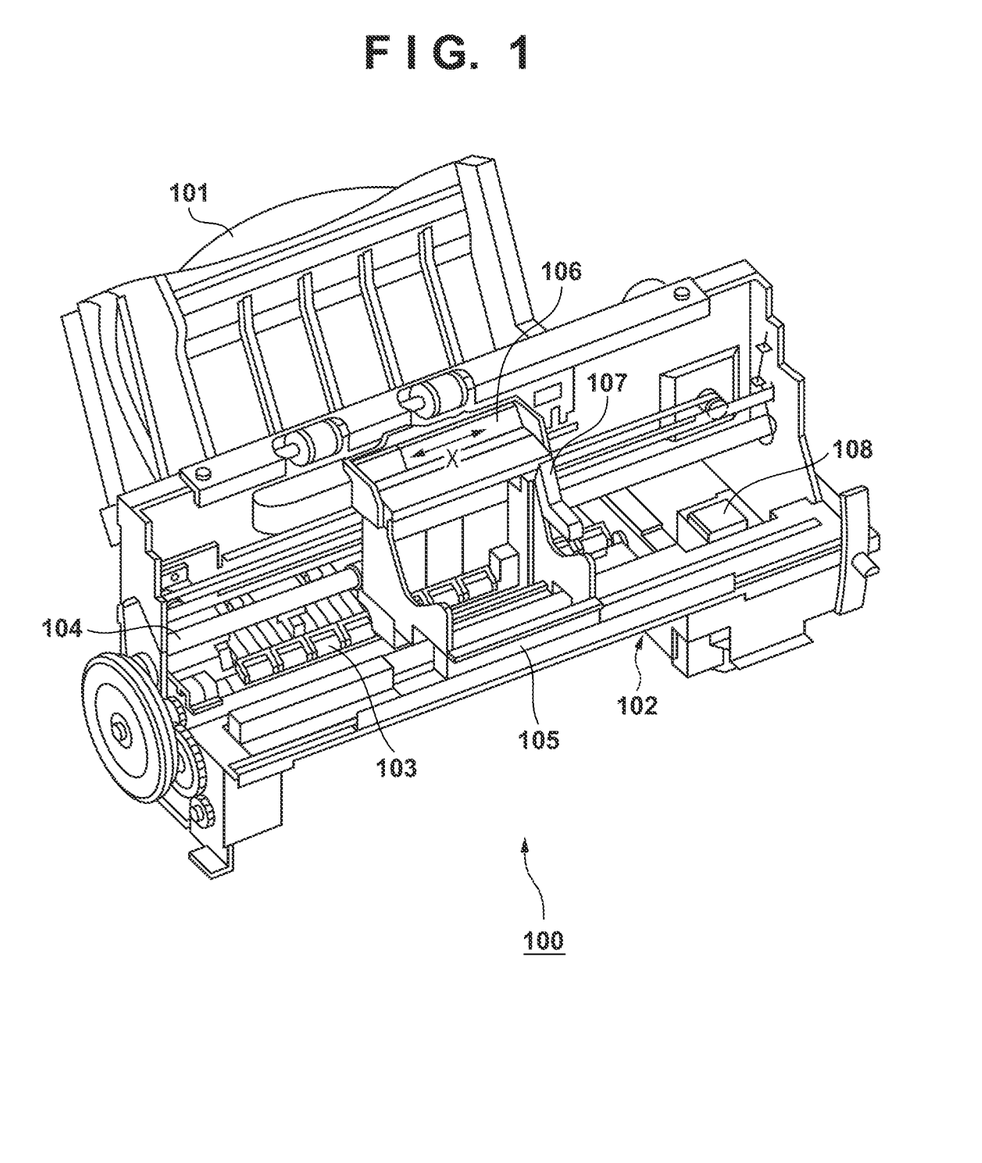
FIG. 1 is an external perspective view showing a schematic configuration of an inkjet printing apparatus which is an exemplary embodiment of the present invention.

FIG. 1 is a schematic perspective view of an inkjet printing apparatus which is an exemplary embodiment of the present invention. In FIG. 1, the inkjet printing apparatus (hereinafter, the printing apparatus) 100 includes an automatic feeding unit (ADF) 101, a conveying unit 103, and a recovery unit 108. An automatic feeding unit 101 automatically feeds a printing medium such as a sheet into the apparatus main body. The conveying unit 103 guides printing media to be sent out one by one from the automatic feeding unit 101 to a predetermined printing position, and also guides the printing medium from the printing position to a discharging unit 102. The recovery unit 108 performs recovery processing on a printing unit which performs desired printing on a printing medium conveyed to a printing position.

The printing unit includes a carriage 105 which is movably supported in a direction of an arrow X (a main scanning direction) by a guide shaft 104, and a print head which is removably mounted on the carriage 105. The carriage 105 is provided with a carriage cover 106 and a head set lever 107 for engaging the carriage 105 to guide the print head to a predetermined mounting position on the carriage 105. The head set lever 107 engages a tank holder of the print head to press the print head to set it at a predetermined mounting position.

The upper portion of the carriage 105 is arranged so as to be able to rotate with respect to the head set lever shaft, and the portion for engagement with the print head is provided with a spring-biased head set plate (not shown). The spring force causes the head set lever 107 to be mounted to the carriage 105 while pressing the print head.

Figure 2:
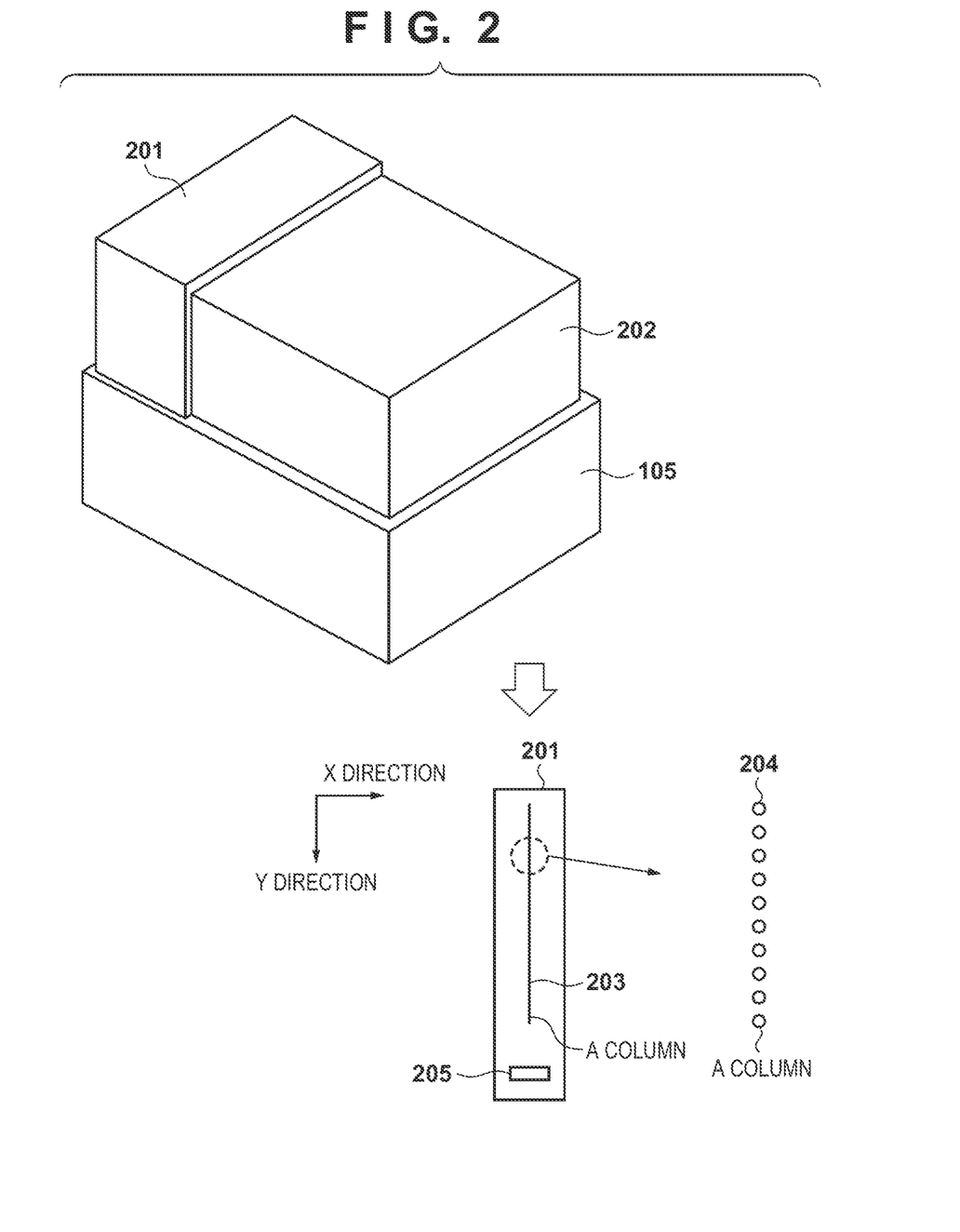
FIG. 2 is a diagram showing a configuration of a print head shown in FIG. 1.

FIG. 2 is an explanatory view of the print head and an ink cartridge mounted on the carriage.

A print head 201 shown in FIG. 2 engages with the carriage 105 and discharges ink from the print head 201 to perform printing. A unit having a print element array corresponding to each ink stored in an ink cartridge 202 is used as the print head 201. The ink cartridge 202 individually stores ink such as black (Bk), cyan (C), magenta (M), and yellow (Y), and integrally constitutes each storage chamber.

As shown in FIG. 2, the print head 201 includes one print element array 203 in which a plurality of print elements 204 are arranged in a Y direction (A column). In FIG. 2, the X direction is a "main scanning direction", and the Y direction is a "sub-scanning direction" perpendicular to the main scanning direction. A print element 204 is an electrothermal conversion element and discharges ink from a nozzle corresponding to the print element 204. This shows a configuration using a heater as an example of an inkjet printing method. The print element array 203 provided in the print head 201 is used for printing a single color component. The print head 201 discharges ink in accordance with movement timing while the carriage 105 is moved in the X direction, thereby executing printing on the printing medium. The print head 201 also includes a temperature detection diode 205.

Figure 3:
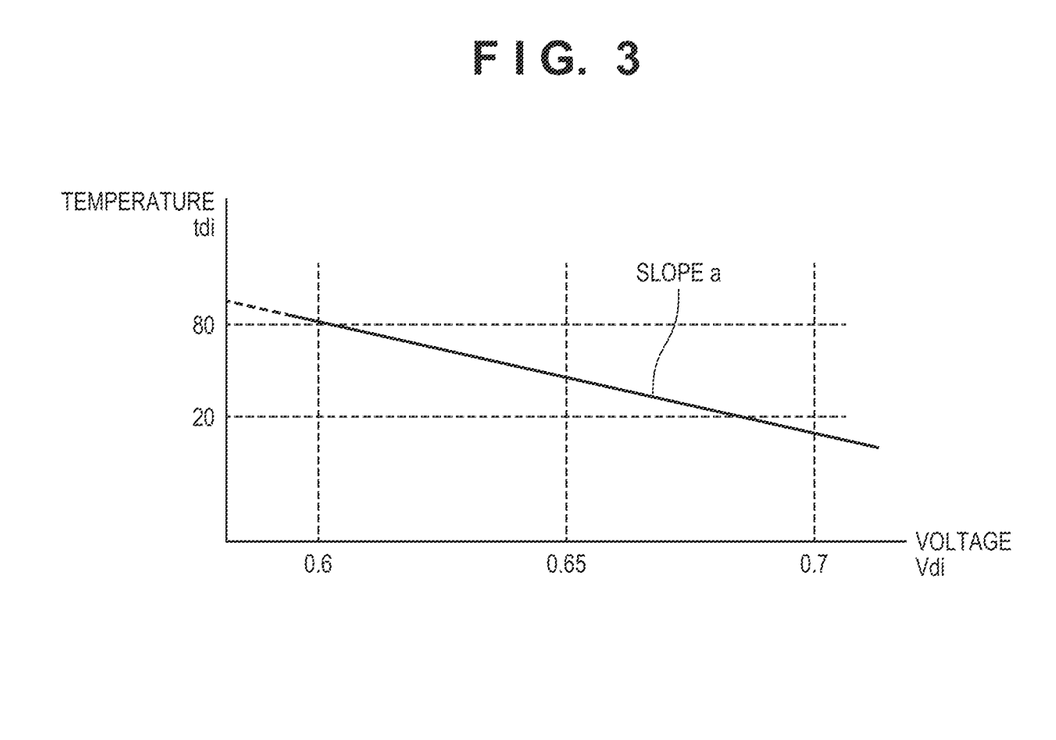
FIG. 3 is a diagram showing a temperature characteristic of a temperature detection diode of the print head shown in FIG. 2.

FIG. 3 is a diagram showing a temperature characteristic of the temperature detection diode. In FIG. 3, the horizontal axis shows the output voltage of the temperature detection diode 205 (Vdi), and the vertical axis indicates the detected temperature (tdi).

As can be understood from the temperature characteristic shown in FIG. 3, the ambient temperature of the print head 201 can be detected in accordance with the slope a. Configuration may be such that there is only one temperature detection diode 205 per print head or one may be assigned to each nozzle row. Depending on the purpose of use of the printing apparatus, a temperature detection diode 205 may be provided at the upper portion and the lower portion of each nozzle row to acquire the temperature in accordance with a plurality of positions of the print head 201.

Here, an IC 301 used as a control circuit in the printing apparatus 100 will be described.

Figure 4:
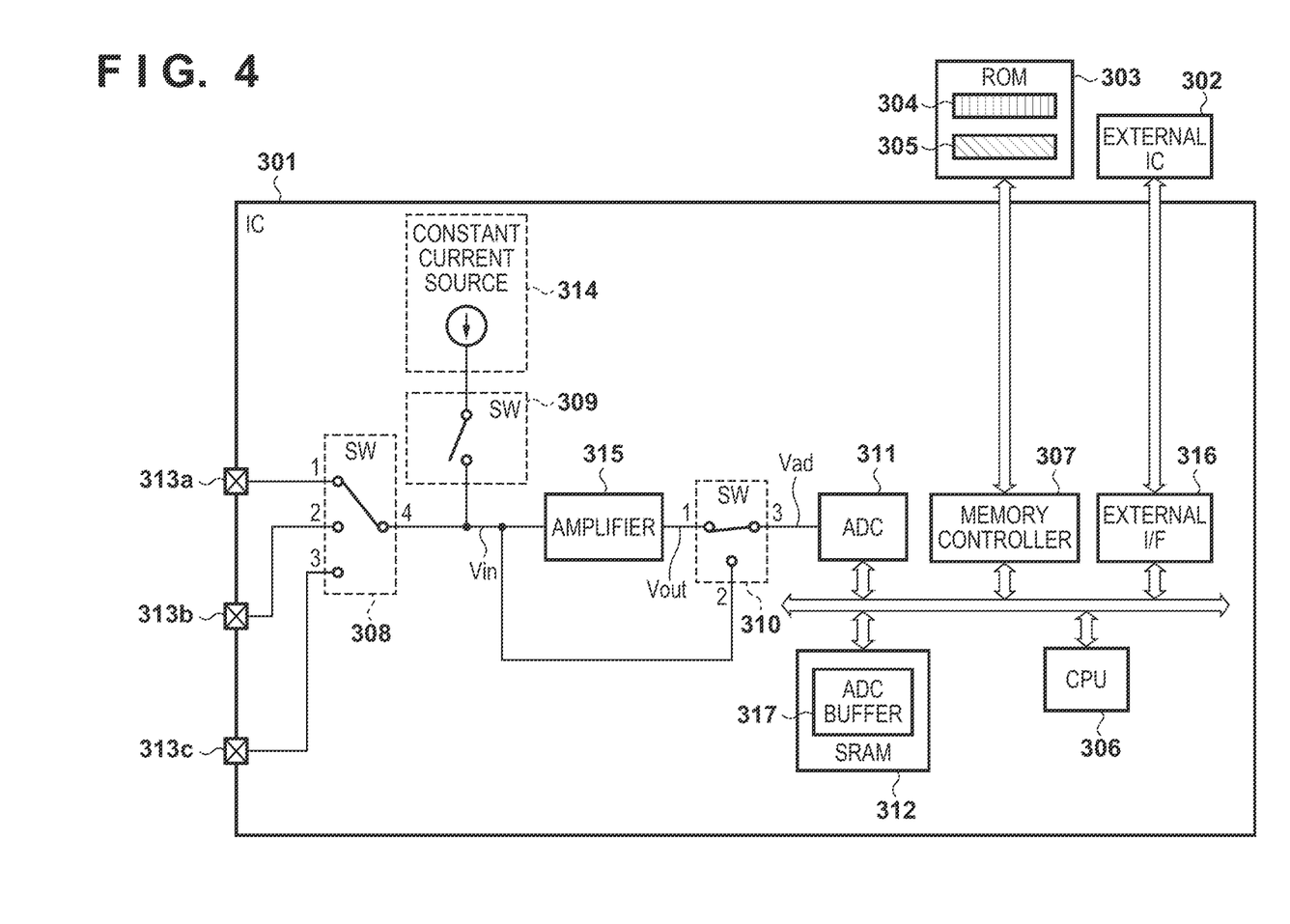
FIG. 4 is a block diagram showing a control configuration of the printing apparatus shown in FIG. 1.

FIG. 4 is a block diagram showing a detailed configuration of the IC 301. Although a plurality of ICs are used in an actual inkjet printing apparatus and have a complicated structure, the IC relating to this embodiment and the internal configuration of the IC will be described here. Further, FIG. 4 illustrates a form in which an external IC 302 and a ROM 303 are connected to explain data flow other than that of the IC 301.

The ROM 303 includes a program region 304 for storing a control program for controlling the inkjet printing apparatus, and a data region 305 for storing data as appropriate. A CPU 306 executes control for driving the print element, relative conveyance control between the print element and the sheet, and the like in accordance with a control program stored in the program region 304 of the ROM 303 via a memory controller 307.

The CPU 306 writes data to the data region 305 of the ROM 303 as needed. Since the ROM 303 is a non-volatile memory, written data stored in the data region 305 remains and is not initialized even if the power supply to the printing apparatus is disconnected. The CPU 306 can switch the connections of the various SWs (SW 308 to SW 310) of the IC 301, set an operation mode of the ADC (AD converter) 311, and control the reading/writing of data of an SRAM 312 in accordance with the operation. Here, the SW 308 is an input selection switch used for switching the input of the input terminal 313, and an SW 309 is a constant current source selection switch used for switching whether the connections of the input terminals 313a to 313c and a constant current source 314 are open/short. Further, an SW 310 is an ADC input voltage selection switch for switching whether the voltage input from the input terminals 313a to 313c to the input voltage of the ADC 311 is input as is or whether the voltage amplified by an amplifier 315 is input.

The input voltages of the input terminals 313a to 313c are converted into digital values by the ADC 311 in accordance with the states of the various SW settings, and the converted digital values are written into an ADC buffer 317 of the SRAM 312. The data written to the ADC buffer 317 can be read at any time by the CPU 306. Switching of connections of various SWs (SW 308 to SW 310), setting of the ADC 311, and reading/writing of data of the SRAM 312 can also be controlled from the external IC 302 connected via an external I/F 316.

Incidentally, configuration may be such that the CPU 306 and the memory controller 307 are not mounted inside the IC 301, and various settings of the IC 301 are performed from the external IC 302.

The external I/F 316 may perform communication in accordance with 12C and UART interface protocols, or a high-speed communication connection configuration such as PCIe may be employed. The communication protocol of the external I/F 316 can determine the interface according to the situation of the printing apparatus. If all the processes can be completed within the IC 301, the external I/F 316 need not be provided.

Figure 5:
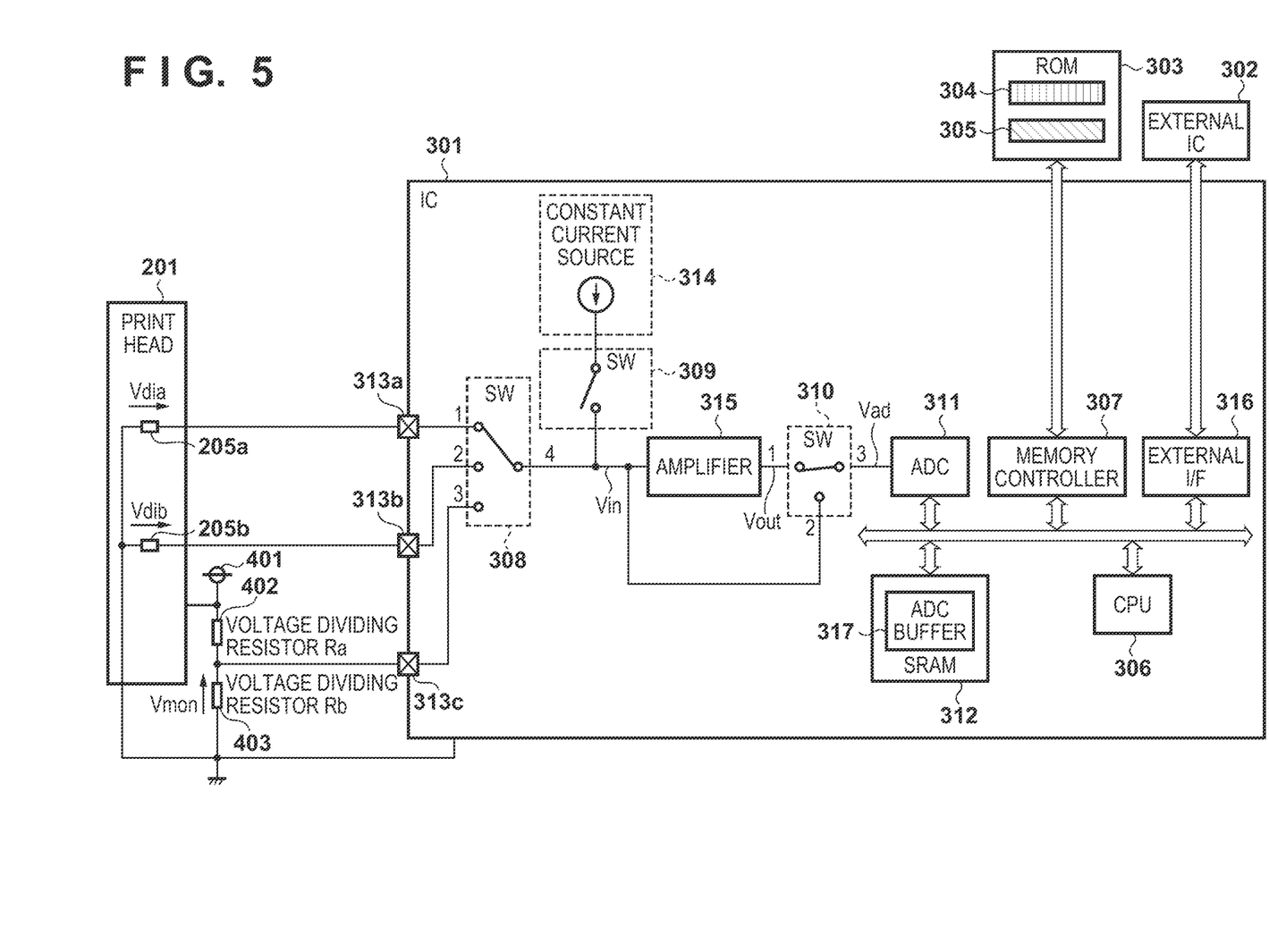
FIG. 5 is a diagram showing a configuration of a connection between the printing apparatus and the print head.

Next, a temperature detection configuration of the temperature detection diode 205a mounted on the print head 201 when the IC 301 and the print head 201 are connected will be described.

FIG. 5 is a block diagram illustrating a configuration of a connection between the IC and the print head.

The print head 201 includes the print element array 203 corresponding to each of black (Bk), cyan (C), magenta (M), and yellow (Y) inks. One temperature detection diode 205a is provided in the vicinity of the print element array 203 that discharges black ink, and one temperature detection diode 205b is provided in the vicinity of the three print element arrays 203 that discharge cyan, magenta, and yellow inks. The temperature detection diodes 205a and 205b are connected to the input terminals 313a and 313b of the IC 301, respectively, via cables.

Further, a head power source 401, which is a power supply for driving the heater, is connected to the print head 201 to supply power. Since the voltage for driving the heater is driven at a relatively high voltage such as 32V or 24V, when abnormal operation occurs or power supply is performed at an unintended timing, it leads to damage of the print head.

Therefore, in order to monitor the voltage application state of the head power source 401, the monitor voltage Vmon for monitoring the state is inputted to the input terminal 313c of the IC 301. The monitor voltage Vmon is inputted by dropping the voltage of the head power source 401 to a voltage guaranteed by the operation of the input terminal 313c of the IC 301 by using a voltage dividing resistor Ra402 and a voltage dividing resistor Rb403. One of the input terminals 313a to 313c is selected as the external input by switching a setting of the SW 308, and is taken into the IC 301 as the input voltage Vin. When the voltage value of the temperature detection diode 205a is to be converted into a digital value, the SW 308 is switched to select a connection (the 1 to 4 connection of the SW 308) with the temperature detection diode 205a.

Since the temperature detection diode 205a does not generate a voltage by a single device, a current is caused to flow from the constant current source 314 to the temperature detection diode 205a by using the SW 309 to generate a temperature detection diode voltage Vdia. On the other hand, it is possible to take in various voltages inside the IC 301 by setting the 2 to 4 connection of the SW 308 to connect the temperature detection diode 205b and setting the 3-4 connection of the SW 308 to connect the monitor voltage Vmon.

At this time, if the monitor voltage Vmon is selected, the SW 309 is put in an open state and the connection with the constant current source 314 is disconnected. Thus, the SW 309 can switch the connection between the constant current source 314 and the input terminal 313 to shorted or open in accordance with the device or element to be connected. Because the voltage value Vdia selected by the SW 308 varies only minutely, the voltage is amplified by the amplifier 315 to widen its dynamic range.

The output voltage Vout of the amplifier 315 is given by Equation (1) which uses the amplification factor A, the offset voltage B, and the input voltage Vin. Specifically, $$Vout = A \cdot Vin + B \quad (1)$$

Here, the amplified voltage Vout is converted from an analog value to a digital value using the ADC 311. In the IC 301 configuration, the input voltage Vad of the ADC 311 is selectable by the SW 310. If the SW 310 selects the voltage after amplification (connection 1 to 3 of the SW 310), Vad=Vout and the voltage can be converted to a digital value. Meanwhile, if the SW 310 selects the voltage before amplification (connection 2 to 3 of the SW 310), Vad=Vin and the voltage is converted to a digital value.

When the temperature detection diode 205a is used, since the amplified voltage is used, the SW 310 amplified voltage is selected (connection 1 to 3 of the SW 310) and is converted to a digital value. When the monitor voltage Vmon is converted to a digital value, it is converted to a digital value with the 2 to 3 connection of the SW 310 and Vad=Vin=Vmon because the voltage does not need to be amplified. The digital value after the conversion can be derived by Equation (2). Specifically, $$AD = (bitmax/Vref) \cdot Vad \quad (2)$$

bitmax of Equation (2) indicates the resolution of the ADC 311. Since the conversion for the IC 301 is 10-bit precision, 1024, which is the tenth power of 2, is the bitmax value, and it is possible to do a conversion into a digital value ranging from 0 to 1023 according to the voltage value of the input voltage Vad. Vref is a reference voltage and, in Equation (2), Vref indicates the range of analog voltages that can be converted. In the IC 301, Vref is set to 3.3V, and voltages up to 3.3V can be converted into digital values. The value converted into a digital value by the ADC 311 is stored in the ADC buffer 317 of the SRAM 312. A digital value stored in the SRAM 312 can be read at any time by the CPU 306 or the external I/F 316.

In this embodiment, the SRAM is used to store the data of the ADC buffer 317, but it is not necessarily an SRAM; a memory such as a DRAM or an SDRAM may be used, or data may be held using a flip-flop.

Here, the relationship between the voltage and the temperature of the temperature detection diodes 205a and 205b is as shown in FIG. 3 and Equation (3). Specifically, $$t = a \cdot Vdi \quad (3)$$

Here, a is a temperature coefficient of the temperature detection diodes 205a and 205b, and t is a temperature derived from a voltage value generated in the temperature detection diodes 205a and 205b. The temperature characteristic shown in FIG. 3 is a proportional relationship between the voltage and temperature as shown by Equation (3), and it is possible to determine the temperature from the voltage by the slope of the temperature coefficient a. When Vdi=Vin of Equation (1) and Vad=Vout of Equation (2), Equation (3) can determine the temperature from the value obtained by digitally converting the voltage value Vdi of the temperature detection diode as in Equation (4). Specifically, $$t = (a/A) \cdot (Vref/bitmax) \cdot AD - B \quad (4)$$

In this manner, the voltage value generated by the temperature detection diodes 205a and 205b can be converted into a digital value, and the temperature can be calculated from the converted voltage value. The temperature information obtained by the calculation determines whether the print head 201 is at an abnormally high temperature. Further, by controlling to select the driving pulse for driving the print head 201 according to the temperature, the image can be formed without unevenness even if the ambient temperature changes.

By the above process, for example, the voltage Vdia generated in the temperature detection diode 205a can be digitally converted.

However, in actual amplifiers, errors occur due to various factors such as precision and production variations in the components constituting the amplifier. Therefore, the value of the amplification factor A and the offset voltage B are different for each IC, and the relationship between the input voltage Vin and Vout is a different value for each IC. As a result, the temperature information also includes an error, so that the printing apparatus is designed to operate with a margin of error so as to work in spite of variations between respective ICs.

Next, some embodiments of correction of errors of the amplifier of the printing apparatus having the above-described configuration will be described.

First Embodiment

Figure 6:
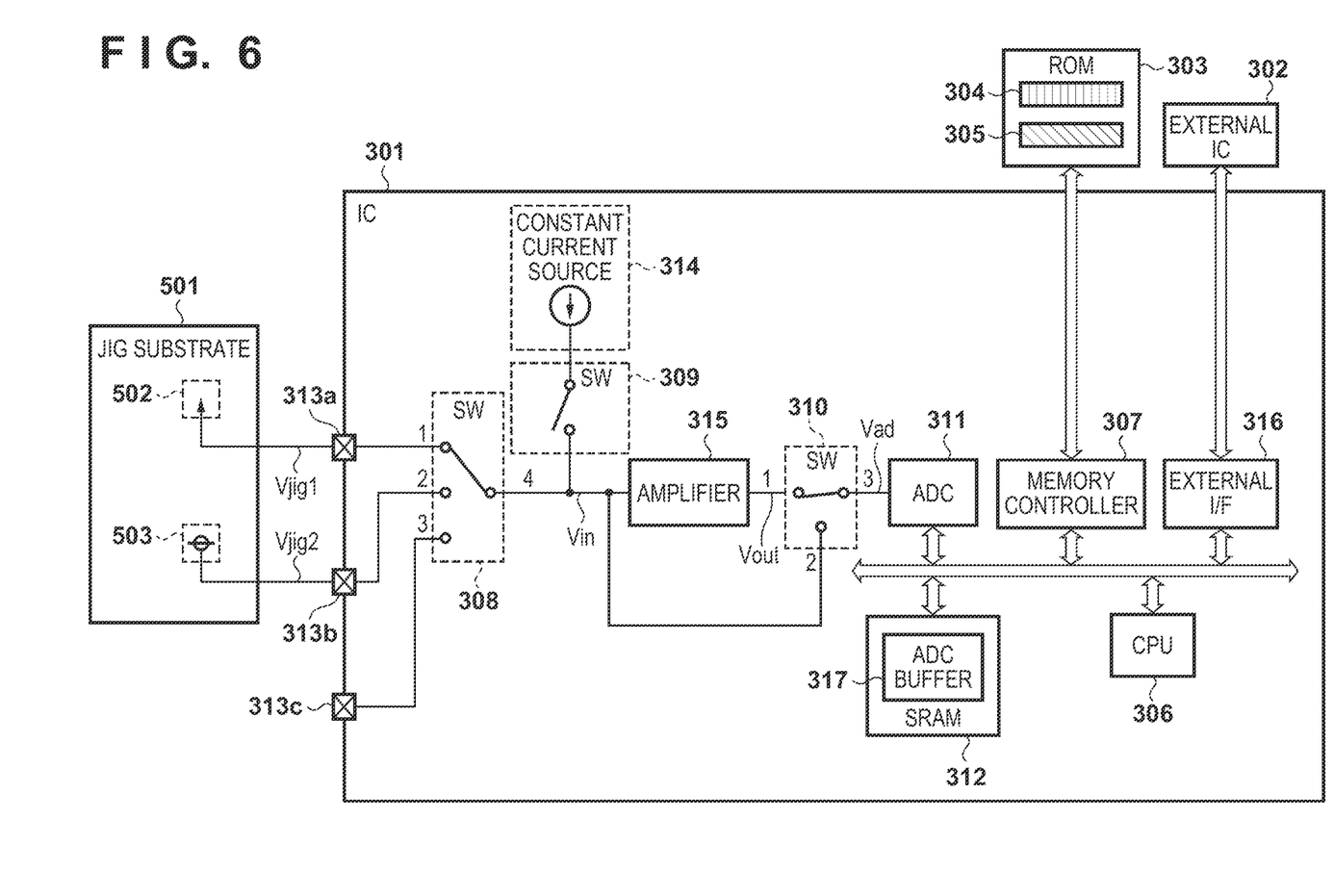
FIG. 6 is a diagram showing a configuration of a connection between a printing apparatus and a jig substrate according to a first embodiment.

FIG. 6 is a block diagram showing a configuration for performing amplifier error correction.

As shown in FIG. 6, a jig substrate 501 is connected to the input terminals 313a to 313b of the IC 301 rather than the print head 201. When the jig substrate 501 is attached, the IC 301 is caused to operate in a correction mode. Here, the IC 301 operates in the correction mode by receiving a correction mode command from the external IC 302.

Incidentally, it is not necessary to use a command from the external IC for this mode switching. For example, an input terminal 313d (not shown) may be provided on the IC 301, and 0 may be inputted to the input terminal 313d when the print head 201 is mounted, and 1 may be inputted to the input terminal 313d when the jig substrate 501 is mounted. In this way, mode switching may be performed depending on the voltage level of the input terminal. Alternatively, a method of starting up in the correction mode when a key switch is connected to the input terminal 313d and it is detected that a key is pressed at the time of turning on the power may be used.

The jig substrate 501 has a constant voltage source 502 for outputting a voltage Vjig1 and a constant voltage source 503 for outputting a voltage Vjig2. The SW 309 is set to OPEN because the constant voltage source 502 and the constant voltage source 503 are used. Here, a digital value ADT1, which can be read when the SW 308 is the connection 1 to 4 and the SW 310 is the connection 2 to 3 can be derived from Equation (2) as shown in Equation (5). Specifically, $$ADT1 = (bitmax/Vref) \cdot Vjig1 \quad (5)$$

Similarly, a digital value ADT2 that is read when the SW 308 is set to the 2 to 4 connection and the SW 310 to the 2 to 3 connection can be derived from Equation (2) as shown in Equation (6). Specifically, $$ADT2 = (bitmax/Vref) \cdot Vjig2 \quad (6)$$

Here, a digital value ADA1, which can be read when the SW 308 is set to the connection 1 to 4 and the SW 310 to the connection 1 to 3 and the amplifier is used, can be derived from Equation (1) to Equation (2) as shown in Equation (7). Specifically, $$ADA1 = (bitmax/Vref) \cdot (A \cdot Vjig1 + B) \quad (7)$$

Similarly, a digital value ADA2 which is read when the SW 308 is set to the connection 1 to 4, the SW 310 is set to the connection 2 to 3, and the amplifier is not used can be derived from Equation (1) to Equation (2) as shown in Equation (8). Specifically, $$ADA2 = (bitmax/Vref) \cdot (A \cdot Vjig2 + B) \quad (8)$$

Here, using Equation (5) to Equation (8), the amplifier amplification factor Areal obtained from the actual measurement value is as shown in Equation (9). Specifically, $$Areal = (ADA1 - ADA2)/(ADT1 - ADT2) \quad (9)$$

On the other hand, when Equation (9) and Equation (5) to Equation (8) are used, the offset voltage Breal of the amplifier obtained from the actual measurement value is as shown in Equation (10). Specifically, $$Breal = (v_{REF}/bitmax) \cdot (ADA1 \cdot ADT2 - ADA2 \cdot ADT1)/(ADT1 - ADT2) \quad (10)$$

That is, by using the constant voltage source 502 of the jig substrate 501 and the constant voltage source 503, it is possible to determine the amplification factor Areal and the offset voltage Breal for each device of the amplifier. Since the amplification factor Areal and the offset voltage Breal shown in Equation (10) are completely determined by the digital value of the ADC 311, they can be derived as system-specific values which cancels out respective amplifier variation that the amplifier 315 has.

Figure 7A:
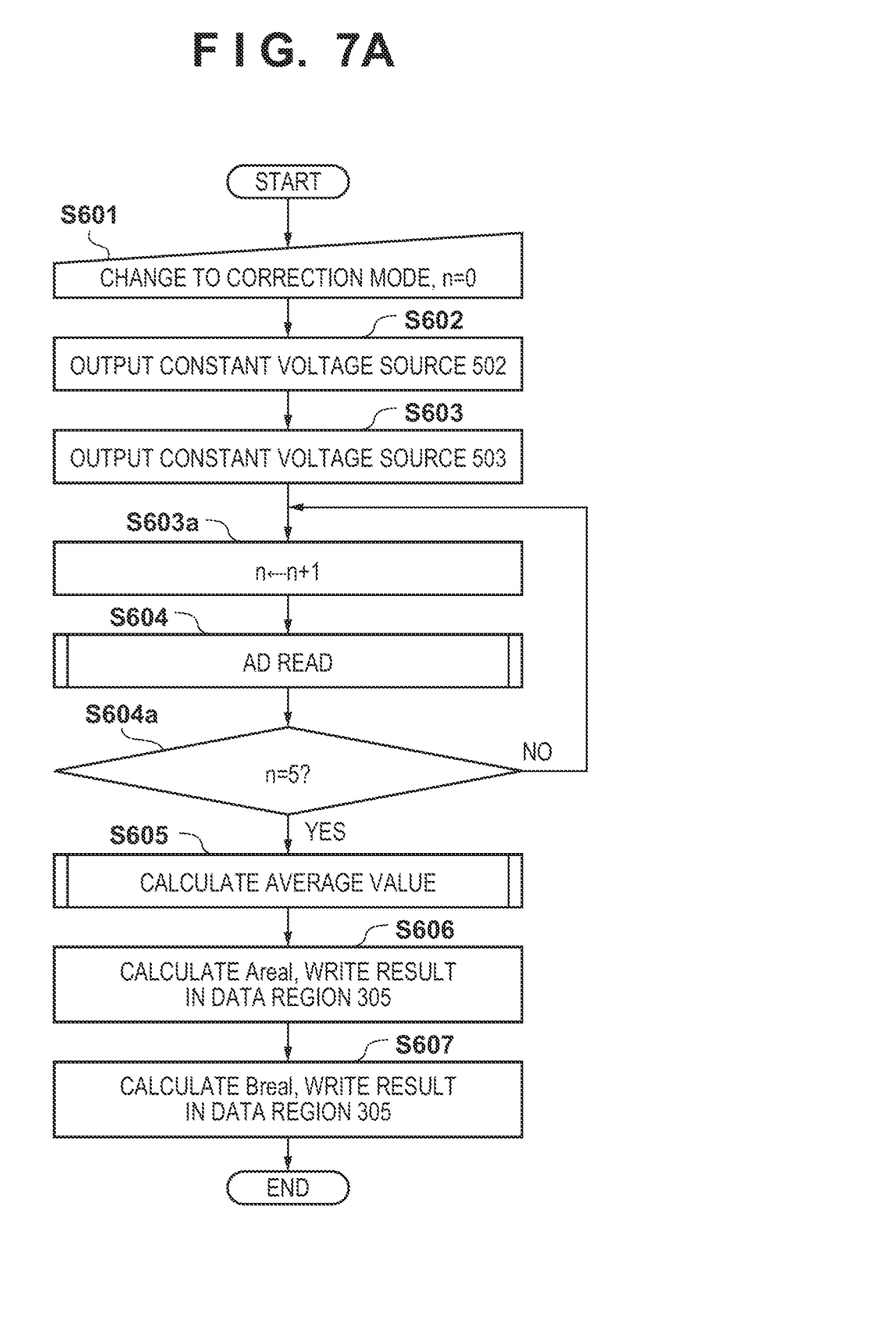
FIGS. 7A, 7B and 7C are flowcharts showing a process for error correction of the amplifier.
Figure 7B:
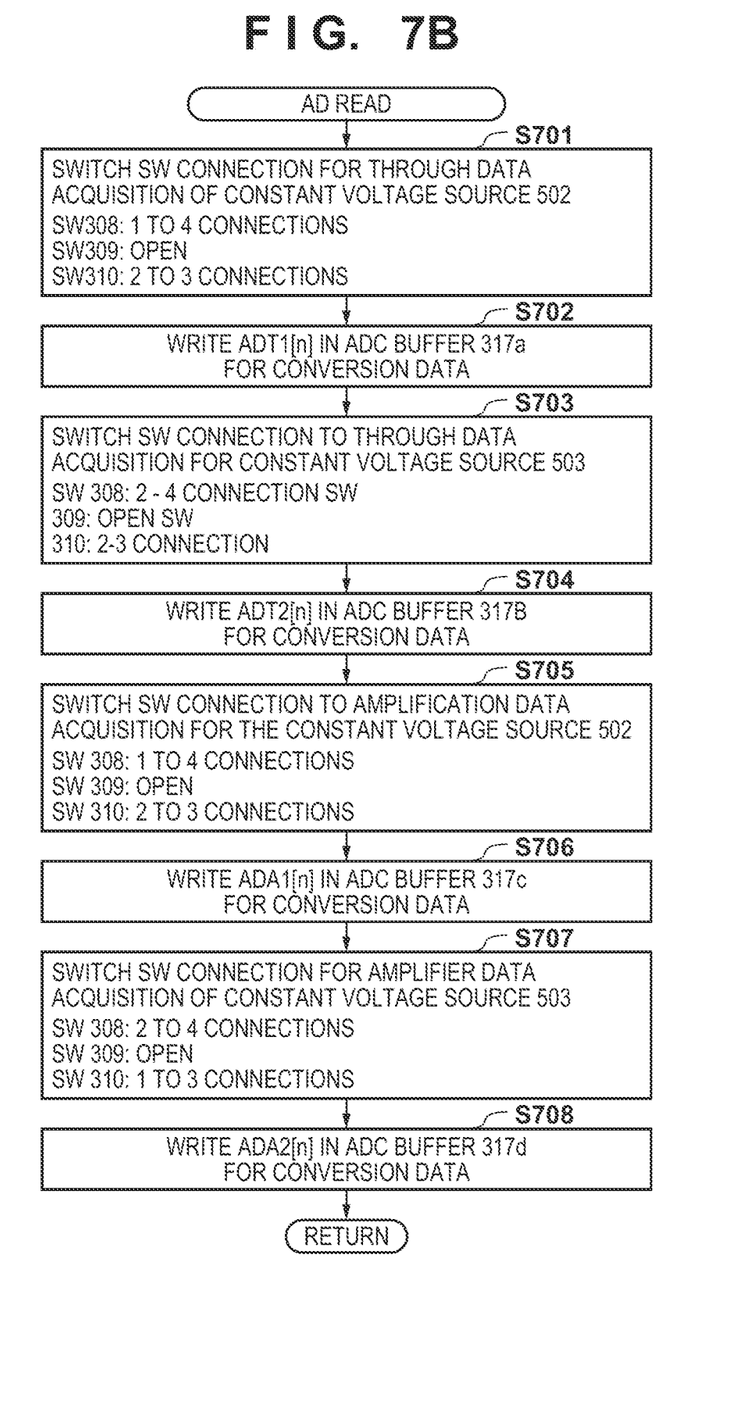
Figure 7C:
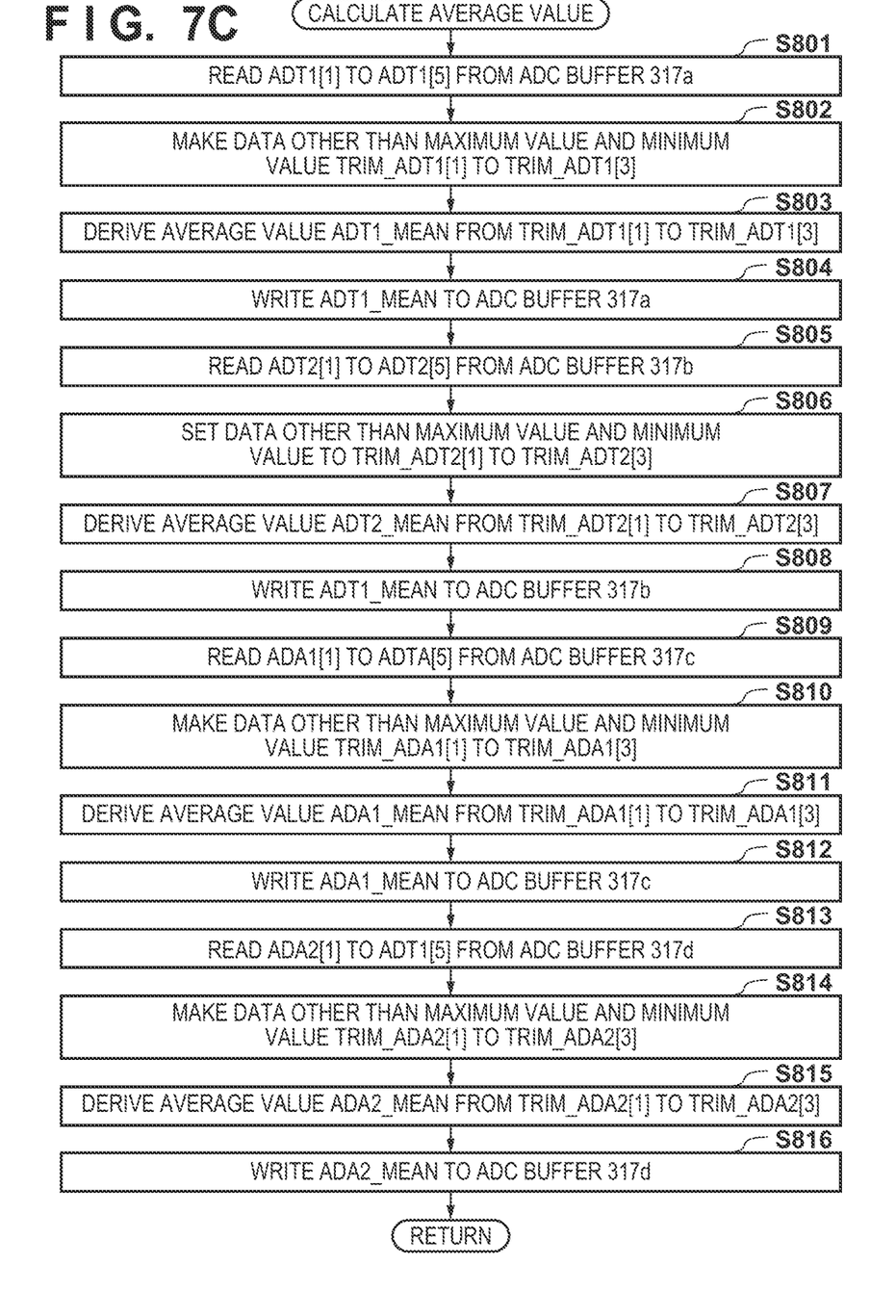

FIG. 7 is a flowchart showing a process for error correction of the amplifier.

According to FIG. 7A, first, in step S601, a correction mode command is transmitted from the external IC 302, and the IC 301 is changed to the correction mode operation. At this time, the parameter (n) indicating the number of reads used in the loop process described below is set to the initial value "0".

Next, in step S602, a voltage of 0.4V is output from the constant voltage source 502 of the jig substrate 501. Next, in step S603, a voltage of 0.7V is output from the constant voltage source 503 of the jig substrate 501.

In the loop processing of step S603a, step S604, and step S604a, switching to select the input terminals 313a to 313b by the SW 308 and switching to select the amplifier 315 by the SW 310 are performed while the parameter (n) is incremented by +1, and a digital value is acquired five times at each setting. The setting of the SWs and the data written to the ADC buffer 317 at the time of obtaining the digital values by AD reading are shown in step S701 to step S708 (FIG. 7B).

According to FIG. 7B, in step S701, in order to obtain the through data of the constant voltage source 502, and sets the various SWs for the next connection. Specifically, the SW 308: 1 to 4 connection, the SW 309: OPEN, and the SW 310: 2 to 3 connection are set. Then, in step S702, a value obtained by conversion into a digital value by the ADC 311 is written in one region 317a of the ADC buffer 317 as through data ADT1[0] of the constant voltage source 502. Hereinafter, this region is referred to as the ADC buffer 317a.

Next, in step S703, in order to obtain the through data of the constant voltage source 503, the various SWs are set for the next connection. Specifically, the SW 308: 2 to 4 connection, the SW 309: OPEN, and the SW 310: 2 to 3 connection are set. Then, in step S704, a value obtained by conversion into a digital value by the ADC 311 is written in one region 317b of the ADC buffer 317 as through data ADT2[0] of the constant voltage source 503. Hereinafter, this region is referred to as the ADC buffer 317b.

Next, in step S705, in order to obtain the amplification data of the constant voltage source 502, the various SWs are set for the next connection. Specifically, the SW 308: 1 to 4 connection, the SW 309: OPEN, and the SW 310: 1 to 3 connection are set. Then, in step S706, a value obtained by conversion into a digital value by the ADC 311 is written in one region 317c of the ADC buffer 317 as amplification data ADA1[0] of the constant voltage source 502. Hereinafter, this region is referred to as the ADC buffer 317c.

Also, in step S707, in order to obtain the amplification data of the constant voltage source 503, the various SWs are set for the next connection. Specifically, the SW 308: 1 to 4 connection, the SW 309: OPEN, and the SW 310: 2 to 3 connection are set. Then, in step S708, a value obtained by conversion into a digital value by the ADC 311 is written in one region 317a of the ADC buffer 317 as amplification data ADA2[0] of the constant voltage source 503. Hereinafter, this region is referred to as an ADC buffer 317d.

As can be seen from the loop processing of step S603a, step S604, and step S604a, the process from step S701 to step S708 is repeated five times, but the data to be written to the ADC buffers 317a to 317d is not overwritten, and the data is stored in different regions in the order in which they are read. For example, for ADT1, as ADT1[n], data is written as ADT1[1] to ADT1[5] from n=1 to 5 in the order in which they are read from the first to the fifth time.

Returning to continue the description of FIG. 7A, in step S605, an average value is obtained for each of the respective read channels. Details of the average value calculation are given in steps S801 to S816 (FIG. 7C).

According to FIG. 7C, in step S801, the CPU 306 reads ADT1[1] to ADT1[5] stored in the ADC buffer 317a. In step S802, among ADT1[1] to ADT1 [5], the data other than the maximum value and the minimum value is set to TRIM_ADT1[1] to TRIM_ADT1[3]. In step S803, the average value (ADT1_MEAN) of TRIM_ADT1[1] to TRIM_ADT1 [3] is calculated. Then, in step S804, ADT1_MEAN is written into the ADC buffer 317a.

Similarly, with respect to ADT2[1] to ADT2[5] stored in the ADC buffer 317b, the processing of step S805 to step S808 is executed to calculate the value of ADT2_MEAN and write the calculation result into the ADC buffer 317b.

Similarly, with respect to ADA1[1] to ADA1[5] stored in the ADC buffer 317c, the processing of step S809 to step S812 is executed to calculate the value of ADA1_MEAN and write the calculation result into the ADC buffer 317c.

Similarly, with respect to ADA2[1] to ADA2[5] stored in the ADC buffer 317d, the processing of step S813 to step S816 is executed to calculate the value of ADA2_MEAN and write the calculation result into the ADC buffer 317d.

The average value is calculated as described above. Thereafter, the description will be continued by returning to FIG. 7A. In step S606, the CPU 306 reads ADT1_MEAN, ADT2_MEAN, ADA1_MEAN, and ADA2_MEAN from the ADC buffer 317 and calculates the value of the amplification factor Areal of the operational amplifier from Equation (9). The CPU 306 stores the value of Areal in the data region 305 in the ROM 303 via the memory controller 307.

In step S607, the CPU 306 substitutes Areal and ADT1_MEAN, ADT2_MEAN, ADA1_MEAN, and ADA2_MEAN into Equation (10) to calculate the value of the offset voltage Breal of the operational amplifier. The CPU 306 stores the value of Breal in the data region 305 in the ROM 303 via the memory controller 307.

As described above, the amplification factor A and the offset voltage B of Equation (1) can be replaced by Equation (11) using Areal and Breal. Specifically, $$Vout = Areal \cdot Vin + Breal \tag{11}$$

Note that 0.4V output from the constant voltage source 502 and 0.7V output from the constant voltage source 503 in step S602 and step S603 are determined from the characteristics of the amplifier 315. For example, normally, using an amplifier whose characteristics are amplification factor A=5 and offset voltage B=−1, when the output of the constant voltage source 502 is made to be 0.5V and the output of the constant voltage source 503 is made to be 1V, the results of amplification by the amplifier 315 are 1.5V and 4V respectively.

Since the reference voltage Vref of the ADC 311 is 3.3V in the IC 301, when the input voltage of the ADC 311 is 4V, it results in a saturated condition in which conversion to a digital value is not linear, or the value is outside of the operation range from the outset. Therefore, the output voltages of the constant voltage source 502 and the constant voltage source 503 are set at a value that does not exceed the reference voltage Vref of the ADC 311 with the voltage after amplification by the amplifier 315. In this way, conversion of the input voltage of the ADC 311 in the present embodiment into a digital value has a linear characteristic up to 3.3V.

The number of repetitions (n=5) of the loop processing used in step S612 to step S615 and the number of data (3) used for calculating the average value may be different values. It is possible to set the number of processing iterations to 1 and reduce the processing time without performing the averaging process, but there is a possibility of detecting noise when unexpected noise occurs. The number of repetitions may be increased to, for example, n=100, and the averaging process may be performed on 60 data obtained by removing 20 highest and lowest values from the acquired data. However, if the number of repetitions is increased, the processing time and the necessary storage capacity are increased, so that the number of repetitions and the averaging processing method are determined depending on the use environment of the apparatus.

The value used does not have to be an average value. For example, a method in which, when the number of repetitions is set to 20, the value that appears the most is employed, or any other method may be employed as long as the method suppresses the error in reading of the ADC 311.

Next, Equation (12) for temperature calculation is updated by substituting Equation (11) for Equation (4). Specifically, $$t = (a/A\text{real}) \cdot (V\text{ref}/\text{bitmax}) \cdot AD - B\text{real} \quad (12)$$

According to Equation (12), it is possible to perform temperature calculation in a form independent of variations among the respective amplifiers 315.

When the correction is completed in the above process, the IC 301 and the jig substrate 501 are disconnected, and the IC 301 and the print head 201 are returned to a state of being connected as shown in FIG. 5. An appropriate temperature can be obtained by transmitting a normal mode command from the external IC 302, reading digital values of voltages generated in the temperature detection diode 205a and the temperature detection diode 205b, and substituting the digital values into Equation (12).

Therefore, according to the embodiment described above, it is possible to perform temperature detection that is independent of amplifier variation by using the true amplification factor and the offset voltage of the amplifier obtained based on different voltages from the two constant current sources provided in the jig substrate. Further, since it does not require a dedicated circuit or the like for performing correction of the amplifier, there is also an advantage that it is possible to perform correction of the amplifier inexpensively.

In the examples described above, the amplification factor Areal and the offset voltage Breal are stored in the data region 305 in the ROM 303, but they may be stored in the data region 305 in the form shown in Equation (12), and the temperatures may be calculated by simply substituting in the ADC 311 digital value. Further, the correction using the jig substrate 501 is executed in the manufacturing process at the factory at the time of factory shipment, and it is stored in the data region 305 of the ROM 303.

As another method, a dummy head simulating a print head is separately prepared, and a jig substrate is prepared on the dummy head. As necessary, the dummy head may be replaced with the print head 201 to perform the correction.

In addition, the digital values (ADT1[n], ADT2[n], ADA1 [n], and ADA2[n]) and the average values (ADT1_MEAN, ADT2_MEAN, ADA1_MEAN, ADA2_MEAN) of the constant voltage source 502 and the constant voltage source 503 may be taken from the outside. For example, by connecting to an external server via a local area network (LAN) using the external IT 316 and sending the digital values of the constant voltage source 502 and the constant voltage source 503 and the average value thereof to the external server, the external server can store the digital values and the average value thereof for each printing apparatus. By analyzing this accumulated information, an external server can monitor a tendency of variations in each IC 301 lot, aging degradation of jigs, and the like. The management of such intermediate results may be realized by connecting a USB and a PC rather than a server.

Second Embodiment

In the first embodiment, variation in the IC 301 among respective amplifiers 315 is corrected by connecting to the jig substrate 501. In this embodiment, an exemplary configuration in which the constant voltage source 502 and the constant voltage source 503 are incorporated in the printing apparatus 100 by using the unused terminal of the input terminal 313 of the IC 301 will be described.

Figure 8:
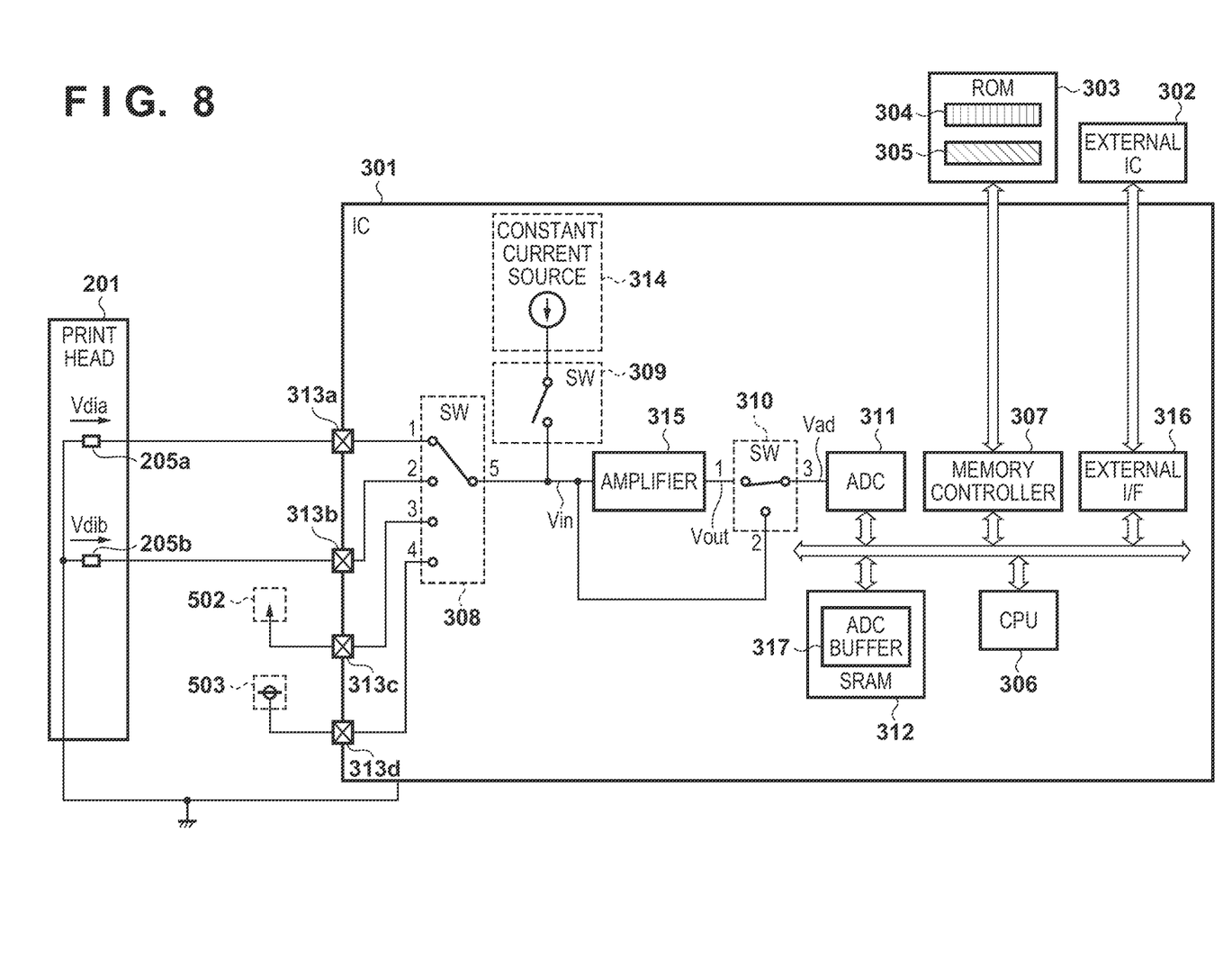
FIG. 8 is a view illustrating a configuration of a connection between the printing apparatus and the print head according to a second embodiment.

FIG. 8 is a block diagram illustrating a configuration of a connection between the IC and the print head according to a second embodiment. In FIG. 8, the same reference numerals are assigned to the same components as those already described with reference to FIGS. 4 to 5, and description thereof is omitted.

As shown in FIG. 8, in this embodiment, the IC 301 has four input terminals 313a to 313d. With such a configuration, the temperature detection diode 205a is connected to the input terminal 313a and the temperature detection diode 205b is connected to the input terminal 313b, and the constant voltage source 502 is connected to the input terminal 313c and the constant voltage source 503 is connected to the input terminal 313d.

When the correction is performed, similarly to the first embodiment, the IC 301 is shifted to the correction mode, the setting of the SWs 308 to 310 is switched, and the digital values of the constant voltage source 502 and the constant voltage source 503 are acquired, thereby obtaining ADT1, ADT2, ADA1, and ADA2 which are required for the correction.

On the other hand, when temperature detection is performed by the temperature detection diode 205a and the temperature detection diode 205b, the IC 301 is shifted to the normal mode, and the setting of the SW 308 to the SW 310 is switched so as to be connected to the temperature detection diode 205a and the temperature detection diode 205b.

According to the configuration shown in FIG. 8, since the correction data can be acquired at any time, it is unnecessary to store correction data such as ADT1, ADT2, ADA1, and ADA2 which is required for the correction in the data region 305 of the ROM 303.

Accordingly, according to the embodiment described above, it is possible to realize a reduction in the data region of the ROM, a configuration without using the ROM. The timing for executing the correction of the amplifier may be any time as long as the corrected data can be used at the time of temperature acquisition. For example, the correction may be executed after the power of the printing apparatus is turned on, or a configuration may by taken to perform a temperature read after having executed correction each time and immediately before the temperature is read.

Third Embodiment

As shown in FIGS. 5 and 6, three input terminals were required for the IC 301, since the SW 308 of the IC 301 was used to switch the input voltage in the first embodiment. In this embodiment, an example will be described in which the IC 301 has only one input terminal 313 and can be corrected even in a configuration in which the input of the ADC 311 cannot be switched by the IC 301.

Figure 9:
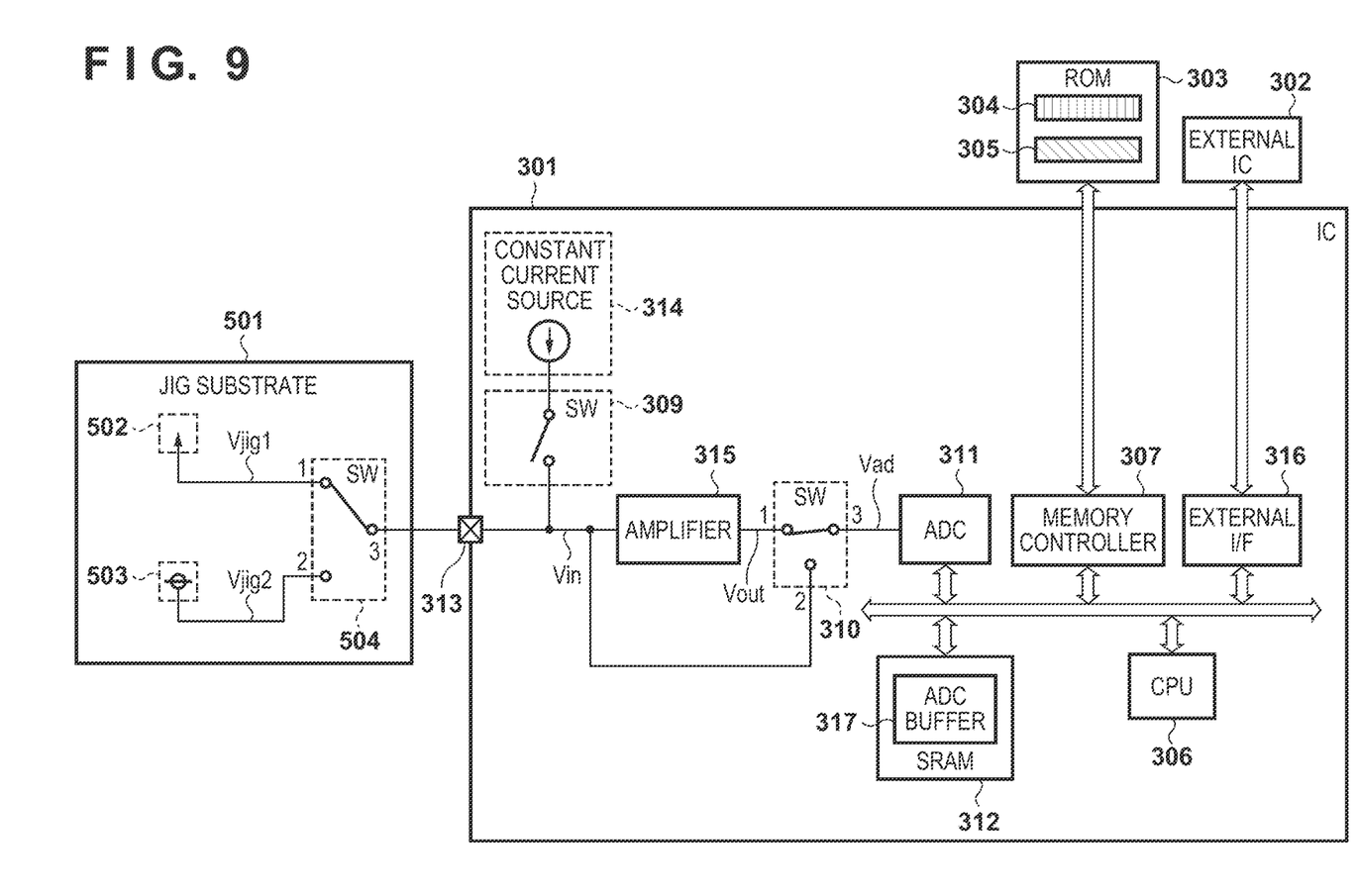
FIG. 9 is a diagram showing a configuration of a connection between the printing apparatus and the jig substrate according to a third embodiment.

FIG. 9 is a block diagram illustrating a configuration of a connection between the IC and the print head according to a third embodiment. In FIG. 9, the same reference numerals are assigned to the same components as those already described with reference to FIGS. 4 to 5, and description thereof is omitted.

As shown in FIG. 9, the IC according to this embodiment has one input terminal 313.

In this case, as shown in FIG. 9, the configuration has a jig switch SW 504 for switching the output voltage to the jig substrate 501. Then, in accordance with the selection of the input voltage, when the constant voltage source 502 is selected, the jig switch SW 504 is set to the 1 to 3 connection, and, when the constant voltage source 503 is selected, the voltage to be input to the input terminal 313 is switched by setting the jig switch SW 504 to the 2 to 3 connection.

Therefore, according to the embodiment described above, by providing a switch to the jig substrate even when the IC is provided with only one input terminal, it is possible to obtain ADT1, ADT2, ADA1, and ADA2 which are required for correction.

The present invention is not limited thereto, and configuration may also be taken such that the jig SW switch 504 and the constant voltage source 503 are omitted from the jig substrate 501, and replaced with the constant voltage source 502, to input two input voltages to the IC 301. Even in such a configuration, by switching the voltage of the variable power supply according to the setting, it is possible to obtain ADT1, ADT2, ADA1, and ADA2 which are required for correction.

Now, two different voltages were input in the first to third embodiments, to perform the correction of the amplifier 315. However, the number of voltages used for the input need not necessarily be two, and amplification factor Areal and the offset voltage Breal may be calculated by inputting more than two voltages. In the first embodiment, the voltages used for input are 0.4V and 0.7V, but the slope may be obtained by using, for example, voltages prepared in 0.1V increments from 0.3V to 0.8V. If the amplification factor Areal and the offset voltage Breal calculated in increments of 0.1V have substantially the same values, it is determined that the amplification factor Areal and the offset voltage Breal can be amplified independently of the voltage level. In this instance, the same amplification factor Areal and offset voltage Breal can be used regardless of the voltage value.

However, there are cases where the amplification factor Areal calculated between 0.3V to 0.4V and the offset voltage Breal and the amplification factor Areal calculated between 0.7V to 0.8V and the offset voltage Breal differ enough that they cannot be said to be equivalent. In this instance, the amplification factor Areal and the offset voltage Breal may be individually provided in accordance with the range of the input voltages.

Therefore, for the handling of the plurality of input voltages, configuration may be taken to input different voltages for each input terminal of the input terminal 313 as in the first and second embodiments, or to, as in the third embodiment, switch the voltage output by the jig substrate with respect to one input terminal. Further, in a form combining the embodiments 1 and 3, after using a plurality of input terminals, it is also possible to input a plurality of input voltages by switching the output voltage of the jig substrate.

In the embodiments described above, the correction of the amplifier included in the IC of the inkjet printing apparatus has been described as an example, but the present invention is not limited thereto. For example, the present invention can also be applied to a correction of an amplifier of an IC incorporated in an electronic device such as a multifunction printer (MFP) in which a scanner device and an inkjet printing apparatus and integrated or a single function scanner device.

The present invention is not limited to the above embodiments and various changes and modifications can be made within the spirit and scope of the present invention. Therefore, to apprise the public of the scope of the present invention, the following claims are made.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-168659, filed on Oct. 5, 2020, which is hereby incorporated by reference herein in its entirety.

What is claimed is:

1. An electronic device, comprising:
an input unit configured to input a voltage from each of a first constant voltage source and a second constant voltage source;
an amplifier configured to amplify the voltage inputted by the input unit;
an AD converter configured to convert the voltage inputted by the input unit or a voltage resulting from amplifying the voltage by the amplifier into a digital value; and
a correction unit configured to, based on a first digital value that is based on a voltage from the first constant voltage source and a second digital value that is based on a voltage from the second constant voltage source, which are inputted by the input unit and converted by the AD converter, and a third digital value that is based on a voltage from the first constant voltage source and a fourth digital value that is based on a voltage from the second constant voltage source, which are inputted by the input unit, amplified by the amplifier, and converted by the AD converter, determine an amplification factor of the amplifier and an offset voltage of the amplifier, and according to the determined amplification factor and offset voltage, correct the amplifier.

2. The electronic device according to claim 1, wherein a voltage value inputted from each of the first constant voltage source and the second constant voltage source is a voltage value in a range in which there is a characteristic that a conversion of a voltage value inputted into the AD converter into a digital value that the AD converter outputs is linear.

3. The electronic device according to claim 1, wherein the electronic device has a first mode in which a normal operation is performed and a second mode in which the correction of the amplifier is performed, and the correction unit operates in the second mode.

4. The electronic device according to claim 1, further comprising a storage unit configured to store the first digital value, the second digital value, the third digital value, and the fourth digital value,
wherein the correction unit obtains a predetermined number of the first digital value, the second digital value, the third digital value, and the fourth digital value, and stores them in the storage unit.

5. The electronic device according to claim 4, wherein the correction unit, based on the predetermined number of the first digital value, the second digital value, the third digital value, and the fourth digital value stored in the storage unit, determines an average value for each of the first digital value, the second digital value, the third digital value, and the fourth digital value.

6. The electronic device according to claim 1, further comprising a first switching unit arranged between the amplifier and the AD converter and configured to input into the AD converter either the voltage inputted by the input unit and amplified by the amplifier or the voltage inputted by the input unit.

7. The electronic device according to claim 1, wherein a jig comprising the first constant voltage source and the second constant voltage source is connected to the input unit.

8. The electronic device according to claim 7, further comprising a second switching unit configured to input to the amplifier either a voltage from the first constant voltage source and a voltage from the second constant voltage source.

9. The electronic device according to claim 8, wherein the input unit includes a first input terminal configured to input a voltage from the first constant voltage source and a second input terminal configured to input a voltage from the second constant voltage source, and
the first input terminal and the second input terminal are connected to the second switching unit.

10. The electronic device according to claim 7, wherein the jig comprises a second switching unit configured to switch to either a voltage of the first constant voltage source or a voltage of the second constant voltage source.

11. The electronic device according to claim 10, wherein the input unit is a first input terminal configured to input the voltage switched to by the second switching unit.

12. The electronic device according to claim 1, wherein the first constant voltage source and the second constant voltage source are built in.

13. The electronic device according to claim 1, further comprising an output unit configured to output the first digital value, the second digital value, the third digital value, and the fourth digital value to an external unit.

14. A printing apparatus, comprising the electronic device according to claim 1 and a print head comprising a temperature detection unit,
wherein the voltage outputted from the temperature detection unit is inputted to the input unit, and
the digital value outputted from the AD converter is converted into a temperature of the print head.

15. The printing apparatus according to claim 14, wherein the correction unit is used to correct the temperature of the print head.

* * * * *